(12) United States Patent
Kim

(10) Patent No.: US 7,369,453 B2
(45) Date of Patent: May 6, 2008

(54) MULTI-PORT MEMORY DEVICE AND METHOD OF CONTROLLING THE SAME

(75) Inventor: Youn-Cheul Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 11/375,568

(22) Filed: Mar. 15, 2006

(65) Prior Publication Data

US 2007/0201297 A1   Aug. 30, 2007

(30) Foreign Application Priority Data

Feb. 28, 2006   (KR) .................... 10-2006-0019214

(51) Int. Cl.
*G11C 8/00* (2006.01)
(52) U.S. Cl. ................... 365/230.05; 365/233
(58) Field of Classification Search ........... 365/230.05, 365/233
See application file for complete search history.

(56) References Cited

U.S. PATENT DOCUMENTS

| | | | | |
|---|---|---|---|---|
| 5,812,490 A | * | 9/1998 | Tsukude | ..................... 365/233 |
| 5,959,937 A | * | 9/1999 | Randolph et al. | ........... 365/233 |
| 6,157,990 A | * | 12/2000 | Randolph et al. | ........... 711/154 |
| 6,229,368 B1 | * | 5/2001 | Lee | ............................ 327/292 |
| 6,256,256 B1 | | 7/2001 | Rao | |

FOREIGN PATENT DOCUMENTS

| | | |
|---|---|---|
| JP | 2002-197864 | 7/2002 |
| KR | 10-2000-0018316 | 4/2000 |
| KR | 10-2002-0050092 | 6/2002 |

\* cited by examiner

*Primary Examiner*—Hoai V. Ho
(74) *Attorney, Agent, or Firm*—Harness, Dickey & Pierce, P.L.C.

(57) ABSTRACT

A multi-port memory device providing various frequencies for ports is disclosed. The multi-port memory device includes a memory core, a clock generator and a plurality of ports. The clock generator generates an internal clock signal based on an external clock signal. Each of the ports has a local clock generator that generates a local clock signal having a predetermined frequency based on the internal clock signal and accesses the memory core in response to the local clock signal. The multi-port memory device may generate various frequencies for ports without increasing the number of pins for receiving clock signals.

9 Claims, 5 Drawing Sheets

100

MULTI-PORT MEMORY DEVICE AND METHOD OF CONTROLLING THE SAME

CLAIM FOR PRIORITY

This application claims priority under 35 U.S.C. § 119 to Korean Patent Application No. 2006-19214 filed on Feb. 28, 2006, the contents of which are herein incorporated by reference in their entirety.

BACKGROUND OF THE INVENTION

The present invention relates to a semiconductor memory device and a method of controlling a semiconductor memory device, and more particularly to a semiconductor memory device having a plurality of ports and a method of controlling a semiconductor memory device having a plurality of ports.

A multi-port memory device includes a plurality of ports to be used in various application systems. A multi-port memory device is disclosed in Korean Patent Publication Number 2002-50092.

FIG. 1 is a block diagram illustrating a conventional multi-port memory device. Referring to FIG. 1, the multi-port memory device 100 includes a memory core 110 having memory banks 111, 112 and 113 and ports 120, 130, 140 and 150. The port 120 provides data DQ1 received from an external source to the memory core 110 or outputs data that is stored in the memory core 110 to an external source in response to a first external clock signal CLK1, an address signal ADDR1 and a command signal CMD1. The port 130 provides data DQ2 received from an external source to the memory core 110 or outputs data that is stored in the memory core 110 to an external source in response to a second external clock signal CLK2, an address signal ADDR2 and a command signal CMD2. The port 140 provides data DQ3 received from an external source to the memory core 110 or outputs data that is stored in the memory core 110 to an external source in response to a third external clock signal CLK3, an address signal ADDR3 and a command signal CMD3. The port 150 provides data DQ4 received from an external source to the memory core 110 or outputs data that is stored in the memory core 110 to an external source in response to a fourth external clock signal CLK4, an address signal ADDR4 and a command signal CMD4.

FIG. 2 is a block diagram illustrating another conventional multi-port memory device. Referring to FIG. 2, the multi-port memory device 200 includes a memory core 210 having memory banks 211, 212 and 213, ports 220, 230, 240 and 250 and a clock generator 260. The clock generator 260 generates an internal clock signal ICLK based on an external clock signal CLK. The port 220 provides data DQ1 received from an external source to the memory core 210 or outputs data that is stored in the memory core 210 to an external source in response to the internal clock signal ICLK, an address signal ADDR1 and a command signal CMD1. The port 230 provides data DQ2 received from an external source to the memory core 210 or outputs data that is stored in the memory core 210 to an external source in response to the internal clock signal ICLK, an address signal ADDR2 and a command signal CMD2. The port 240 provides data DQ3 received from an external source to the memory core 210 or outputs data that is stored in the memory core 210 to an external source in response to the internal clock signal ICLK, an address signal ADDR3 and a command signal CMD3. The port 250 provides data DQ received from an external source to the memory core 210 or outputs data that is stored in the memory core 210 to an external source in response to the internal clock signal ICLK, an address signal ADDR4 and a command signal CMD4.

In the conventional multi-port memory device 100 shown in FIG. 1, each of the ports 120, 130, 140 and 150 operates in response to one of the clock signals CLK1, CLK2, CLK3 and CLK4 having different frequencies received from an external source. Accordingly, The multi-port memory device 100 having a structure of FIG. 1 needs to have pins for receiving the clock signals CLK1, CLK2, CLK3 and CLK4 from external sources.

In the conventional multi-port memory device 200 shown in FIG. 2, all of the ports 120, 130, 140 and 150 operate in response to the internal clock signal ICLK. Accordingly, there may be limits in adapting the multi-port memory device 200 shown in FIG. 2 for applications operating at different frequencies.

Accordingly, it is necessary to design a multi-port memory device having ports that may operate at various frequencies.

SUMMARY OF THE INVENTION

Example embodiments of the present invention may provide a multi-port memory device capable of providing various frequencies for ports without increasing the number of pins.

Example embodiments of the present invention may also provide a method of controlling a multi-port memory device capable of providing various frequencies for ports without increasing the number of pins.

According to an example embodiment of the present invention, there is provided a multi-port memory device including a memory core, a clock generator and a plurality of ports.

The clock generator generates an internal clock signal based on an external clock signal. Each of the ports has a local clock generator that generates a local clock signal having a predetermined frequency based on the internal clock signal and accesses the memory core in response to the local clock signal.

According to an example embodiment of the present invention, there is provided a multi-port memory device including a memory core, a clock generator and a plurality of ports.

The clock generator generates a plurality of internal clock signals having different frequencies from each other based on an external clock signal. Each of the ports has a local clock generator that generates a local clock signal having a predetermined frequency based on the plurality of internal clock signals and accesses the memory core in response to the internal clock signals.

In an example embodiment of the present invention, the predetermined frequency of the local clock signal may be set based on an MRS signal.

According to an example embodiment of the present invention, there is provided a multi-port memory device including a memory core, a clock generator and a plurality of ports.

The clock generator generates a plurality of internal clock signals having different frequencies from each other based on an external clock signal. The plurality of ports accesses the memory core in response to the plurality of internal clock signals.

According to an example embodiment of the present invention, there is provided a method of controlling a multi-port memory device including generating an internal clock signal based on an external clock signal, generating a local clock signal having a predetermined frequency based on the internal clock signal, and accessing the memory core in response to the local clock signal.

According to an example embodiment of the present invention, there is provided a method of controlling a multi-port memory device including generating a plurality of internal clock signals having different frequencies from each other based on an external clock signal, generating local clock signals based on the plurality of internal clock signals so that each local clock signal has a predetermined frequency, and accessing the memory core in response to the local clock signals.

According to an example embodiment of the present invention, there is provided a method of controlling a multi-port memory device including generating a plurality of internal clock signals having different frequencies from each other based on an external clock signal, and accessing the memory core in response to the plurality of internal clock signals.

BRIEF DESCRIPTION OF THE DRAWINGS

The foregoing and other features and advantages of the invention will be apparent from the more particular description of an embodiment of the invention, as illustrated in the accompanying drawings. The drawings are not necessarily to scale, emphasis instead being placed upon illustrating the principles of the invention. Like reference numerals refer to like elements throughout the drawings.

DESCRIPTION OF THE EMBODIMENTS

Figure 1:
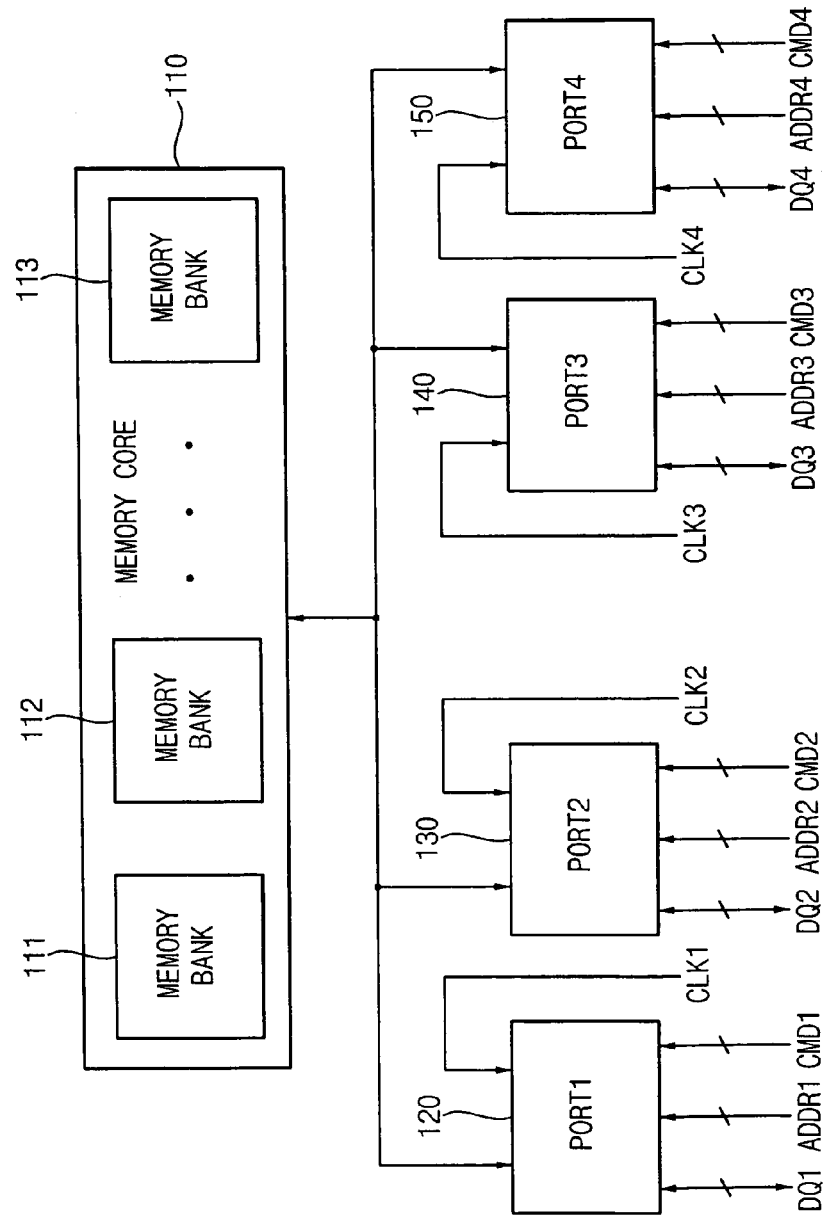
FIG. 1 is a block diagram illustrating a conventional multi-port memory device.
Figure 2:
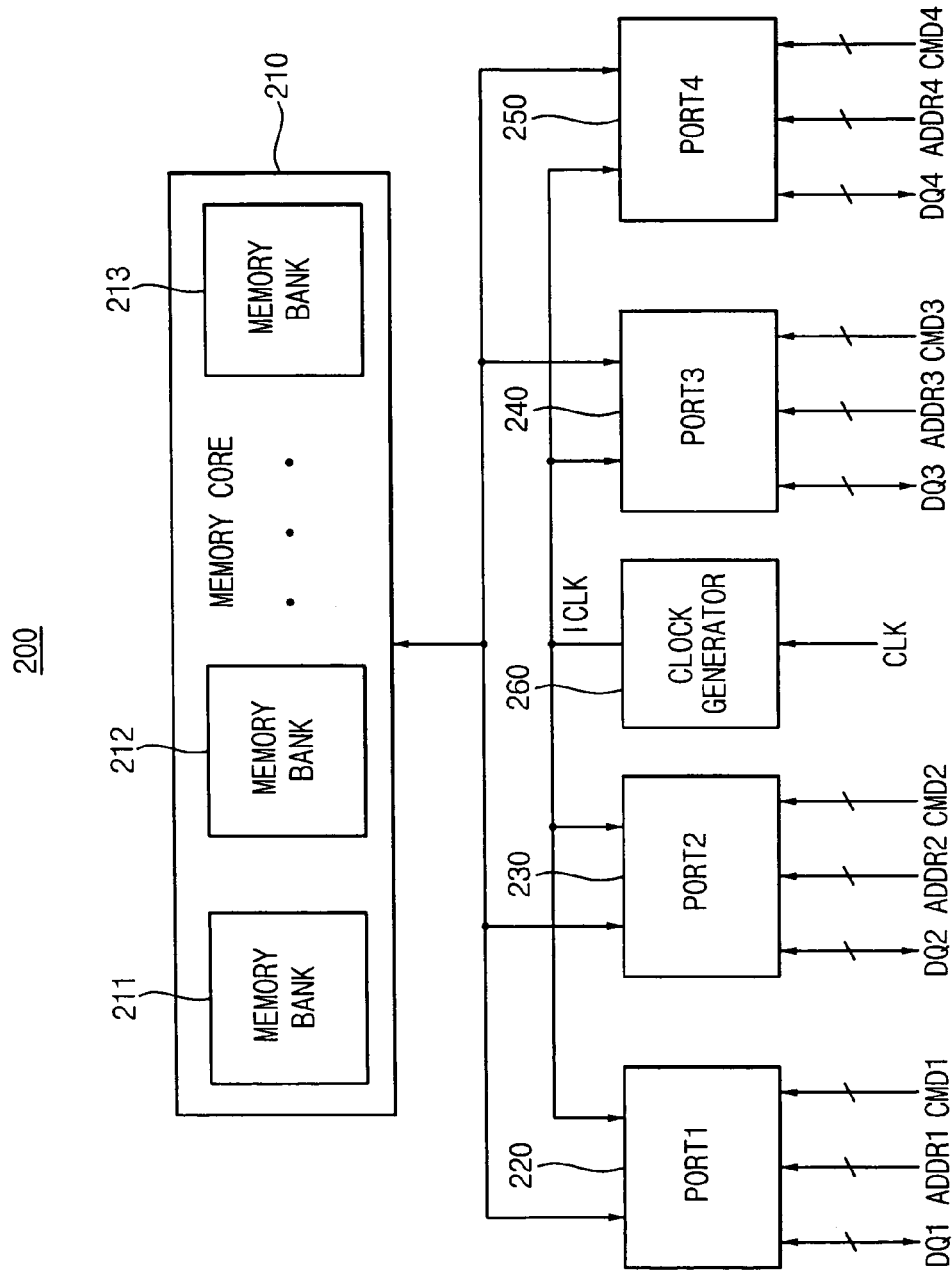
FIG. 2 is a block diagram illustrating another conventional multi-port memory device.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
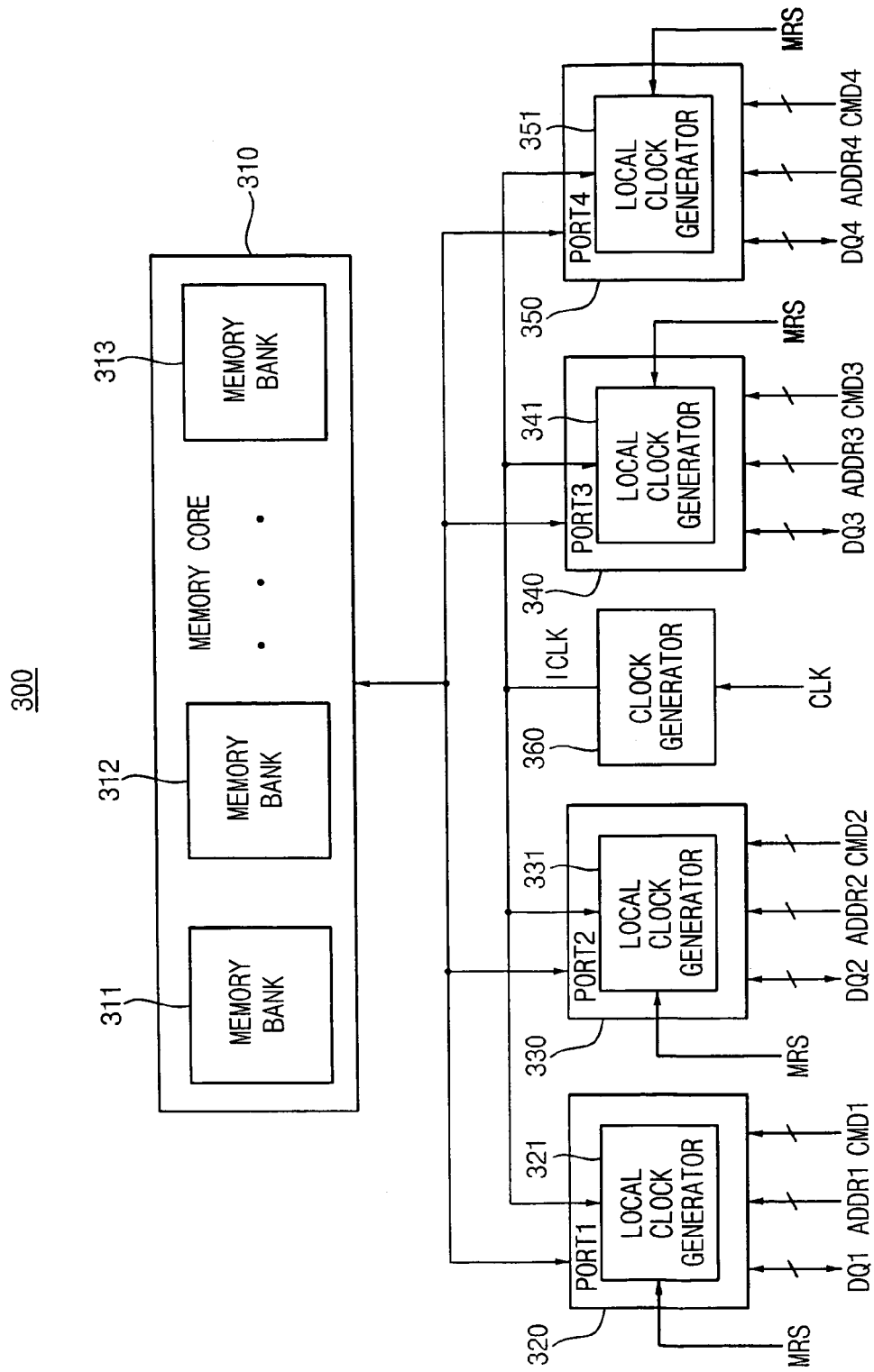
FIG. 3 is a block diagram illustrating a multi-port memory device according to a first example embodiment of the present invention.

FIG. 3 is a block diagram illustrating a multi-port memory device according to a first example embodiment of the present invention.

Referring to FIG. 3, the multi-port memory device 300 includes a memory core 310 having memory banks 311, 312 and 313, ports 320, 330, 340 and 350 and a clock generator 360. Each of the ports 320, 330, 340 and 350 includes a local clock generator 321, 331, 341 or 351, respectively. The clock generator 360 generates an internal clock signal ICLK based on an external clock signal CLK. The local clock generator 321 generates a first local clock signal having a first frequency and/or a first bandwidth based on the internal clock signal ICLK. The local clock generator 331 generates a second local clock signal having a second frequency and/or a second bandwidth based on the internal clock signal ICLK. The local clock generator 341 generates a third local clock signal having a third frequency and/or a third bandwidth based on the internal clock signal ICLK. The local clock generator 351 generates a fourth local clock signal having a fourth frequency and/or a fourth bandwidth based on the internal clock signal ICLK. The frequencies of the local clock signals generated by the local clock generators 321, 332, 341 and 351 may be set based on a mode register set (MRS) signal.

The port 320 provides data DQ1 to the memory core 310 or outputs data that is stored in the memory core 310 to an external source in response to the first local clock signal, an address signal ADDR1 and a command signal CMD1. The port 330 provides data DQ2 to the memory core 310 or outputs data that is stored in the memory core 310 to an external source in response to the second local clock signal, an address signal ADDR2 and a command signal CMD2. The port 340 provides data DQ3 to the memory core 310 or outputs data that is stored in the memory core 310 to an external source in response to the third local clock signal, an address signal ADDR3 and a command signal CMD3. The port 350 provides data DQ4 to the memory core 310 or outputs data that is stored in the memory core 310 to an external source in response to the fourth local clock signal, an address signal ADDR4 and a command signal CMD4.

Hereinafter, the operation of the multi-port memory device 300 shown in FIG. 3 according to the first example embodiment of the present invention will be described.

The internal clock signal ICLK generated by the clock generator 360 may have one frequency value. Furthermore, the internal clock signal ICLK generated by the clock generator 360 may have one bandwidth value. The internal clock signal ICLK is converted into local clock signals having frequencies and bandwidths suitable for the ports 320, 330, 340 and 350 by the local clock generators 321, 331, 341 and 351, which are included in the ports 320, 330, 340 and 350, respectively.

The multi-port memory device 300 of FIG. 3 receives the external clock signal CLK through one pin (not drawn) and generates the internal clock signal ICLK. The multi-port memory device 300 includes the local clock generators 321, 331, 341 and 351 in the port 320, 330, 340 or 350, respectively, to generate the local clock signals having frequencies and bandwidths suitable for the ports 320, 330, 340 and 350. Accordingly, the multi-port memory device 300 of FIG. 3 may generate clock signals having frequencies and bandwidths suitable for the ports 320, 330, 340 and 350 without increasing the number of pins. The frequencies of the local clock signals that are used in the respective ports may be set based on a mode register set (MRS) signal.

Figure 4:
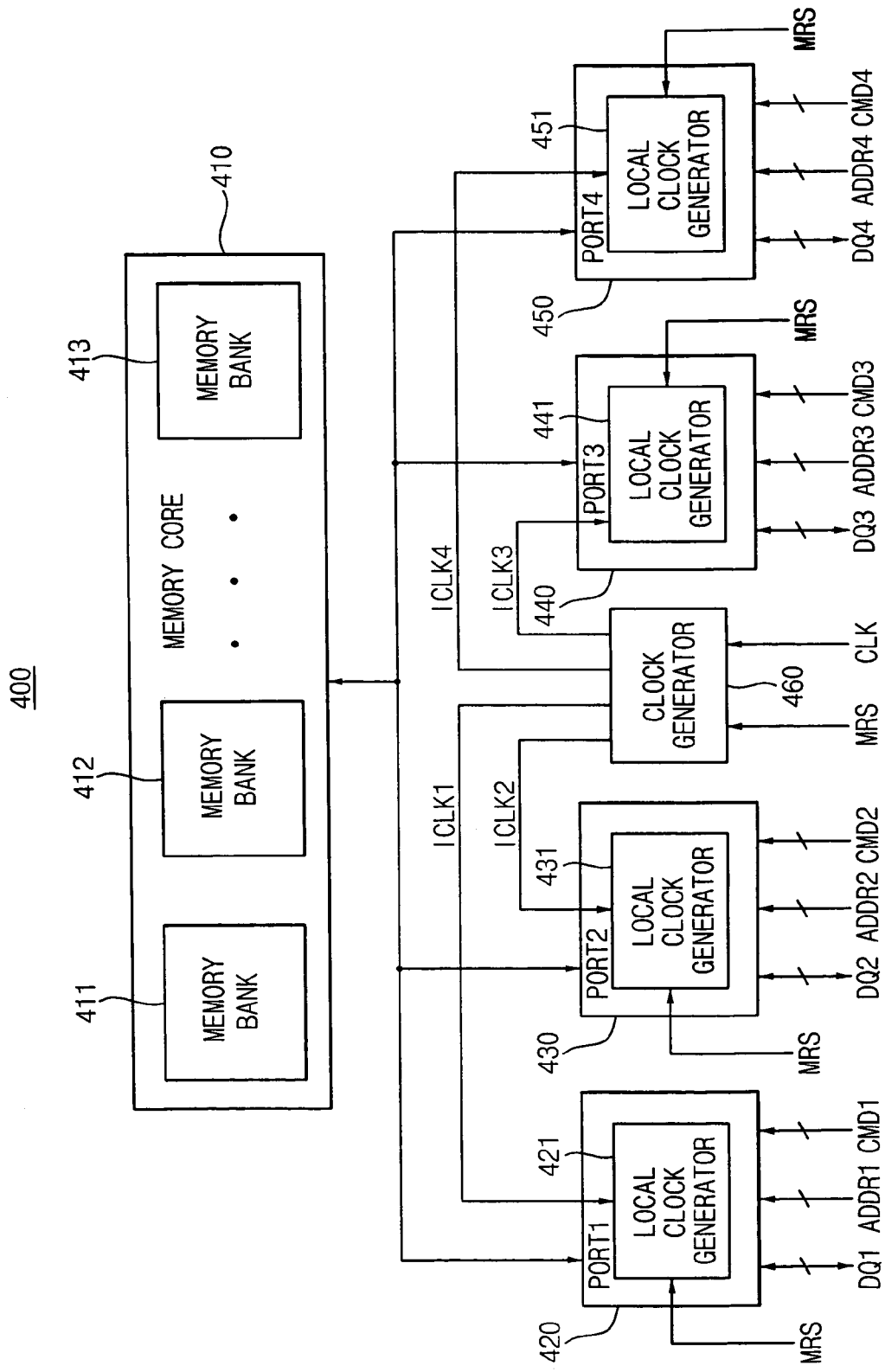
FIG. 4 is a block diagram illustrating a multi-port memory device according to a second example embodiment of the present invention.

FIG. 4 is a block diagram illustrating a multi-port memory device according to a second example embodiment of the present invention.

Referring to FIG. 4, the multi-port memory device 400 includes a memory core 410 having memory banks 411, 412 and 413, ports 420, 430, 440 and 450 and a clock generator 460. Each of the ports 420, 430, 440 and 450 includes a local clock generator 421, 431, 441 or 451, respectively. The clock generator 460 generates internal clock signals ICLK1, ICLK2, ICLK3 and ICLK4 based on an external clock signal CLK. The frequencies of the internal clock signals ICLK1, ICLK2, ICLK3 and ICLK4 may be set based on an MRS signal.

The local clock generator 421 generates a first local clock signal having a first frequency and/or a first bandwidth based on the internal clock signal ICLK1. The local clock generator 431 generates a second local clock signal having a second frequency and/or a second bandwidth based on the internal clock signal ICLK2. The local clock generator 441 generates a third local clock signal having a third frequency and/or a third bandwidth based on the internal clock signal ICLK3. The local clock generator 451 generates a fourth local clock signal having a fourth frequency and/or a fourth bandwidth based on the internal clock signal ICLK4. The frequencies of the local clock signals generated by the local clock generators 421, 431, 441 and 451 may be set based on an MRS signal.

The port 420 provides data DQ1 to the memory core 410 or outputs data that is stored in the memory core 410 to an external source in response to the first local clock signal, an address signal ADDR1 and a command signal CMD1. The port 430 provides data DQ2 to the memory core 410 or outputs data that is stored in the memory core 410 to an external source in response to the second local clock signal, an address signal ADDR2 and a command signal CMD2. The port 440 provides data DQ3 to the memory core 410 or outputs data that is stored in the memory core 410 to an external source in response to the third local clock signal, an address signal ADDR3 and a command signal CMD3. The port 450 provides data DQ4 to the memory core 410 or outputs data that is stored in the memory core 410 to an external source in response to the fourth local clock signal, an address signal ADDR4 and a command signal CMD4.

Hereinafter, the operation of the multi-port memory device 400 shown in FIG. 4 according to the second example embodiment of the present invention will be described.

The internal clock signals ICLK1, ICLK2, ICLK3 and ICLK4 generated by the clock generator 460 may have different frequencies. Furthermore, the internal clock signals ICLK1, ICLK2, ICLK3 and ICLK4 generated by the clock generator 460 may have different bandwidths. The frequencies of the internal clock signals ICLK1, ICLK2, ICLK3 and ICLK4 may be set based on an MRS signal. The internal clock signals ICLK1, ICLK2, ICLK3 and ICLK4 is converted into local clock signals having frequencies and bandwidths suitable for the ports 420, 430, 440 and 450 by the local clock generators 421, 431, 441 and 451, which are included in the ports 420, 430, 440 and 450, respectively. The frequencies of the local clock signals used in the ports 420, 430, 440 and 450 may be set based on an MRS signal.

The multi-port memory device 400 of FIG. 4 receives the external clock signal CLK through one pin (not drawn) and generates the internal clock signals ICLK1, ICLK2, ICLK3 and ICLK4. The multi-port memory device 400 of FIG. 4 includes the local clock generators 421, 431, 441 and 451 in the port 420, 430, 440 or 450, respectively, to generate the local clock signals having frequencies and bandwidths suitable for the ports 420, 430, 440 and 450. Accordingly, the multi-port memory device 400 shown in FIG. 4 according to the second example embodiment of the present invention may generate clock signals having frequencies and bandwidths suitable for the ports 420, 430, 440 and 450 without increasing the number of pins.

Figure 5:
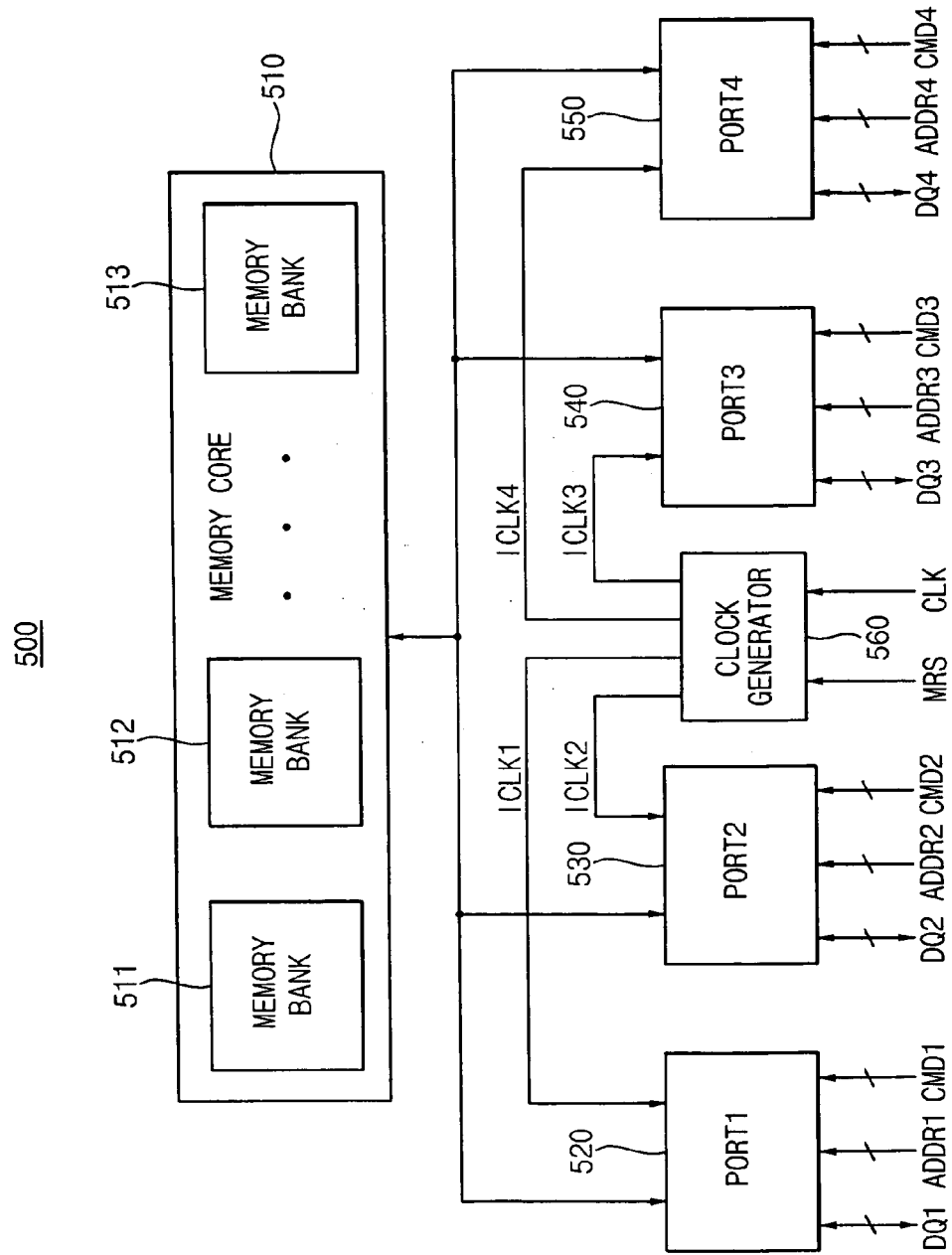
FIG. 5 is a block diagram illustrating a multi-port memory device according to a third example embodiment of the present invention.

FIG. 5 is a block diagram illustrating a multi-port memory device according to a third example embodiment of the present invention.

Referring to FIG. 5, the multi-port memory device 500 includes a memory core 510 having memory banks 511, 512 and 513, ports 520, 530, 540 and 550 and a clock generator 560. The clock generator 560 generates internal clock signals ICLK1, ICLK2, ICLK3 and ICLK4 based on an external clock signal CLK. The frequencies of the internal clock signals ICLK1, ICLK2, ICLK3 and ICLK4 may be set based on an MRS signal.

The port 520 provides data DQ1 to the memory core 510 or outputs data that is stored in the memory core 510 to an external source in response to the internal clock signal ICLK1, an address signal ADDR1 and a command signal CMD1. The port 530 provides data DQ2 to the memory core 510 or outputs data that is stored in the memory core 510 to an external source in response to the internal clock signal ICLK2, an address signal ADDR2 and a command signal CMD2. The port 540 provides data DQ3 to the memory core 510 or outputs data that is stored in the memory core 510 to an external source in response to the internal clock signal ICLK3, an address signal ADDR3 and a command signal CMD3. The port 550 provides data DQ4 to the memory core 510 or outputs data that is stored in the memory core 510 to an external source in response to the internal clock signal ICLK4, an address signal ADDR4 and a command signal CMD4.

Hereinafter, the operation of the multi-port memory device 500 shown in FIG. 5 according to the third example embodiment of the present invention will be described.

The internal clock signals ICLK1, ICLK2, ICLK3 and ICLK4 generated by the clock generator 560 may have different frequencies. Furthermore, the internal clock signals ICLK1, ICLK2, ICLK3 and ICLK4 generated by the clock generator 560 may have different bandwidths. The frequency of each of the internal clock signals ICLK1, ICLK2, ICLK3 and ICLK4 may be set based on an MRS signal.

The multi-port memory device 500 of FIG. 5 receives the external clock signal CLK through one pin (not drawn) and generates the internal clock signals ICLK1, ICLK2, ICLK3 and ICLK4. Accordingly, the multi-port memory device 500 shown in FIG. 5 according to the third example embodiment of the present invention may generate clock signals having frequencies and bandwidths suitable for the ports 520, 530, 540 and 550 without increasing the number of pins.

As described above, the multi-port memory device according to the present invention may generate various frequencies for ports without increasing the number of pins. Furthermore, the multi-port memory device according to the present invention is suitable for low-power applications and may control the frequencies of clock signals.

While the example embodiments of the present invention have been described, it should be understood that various changes, substitutions and alterations can be made herein without departing from the scope of the invention as defined by appended claims.

What is claimed is:

1. A multi-port memory device comprising:
   a memory core;
   a clock generator configured to generate an internal clock signal based on an external clock signal; and
   a plurality of ports, each port including a local clock generator that is configured to generate a local clock signal based on the internal clock signal, and configured to access the memory core in response to the local clock signal, the local clock signal having a predetermined frequency, at least one local clock signal having frequency that is different from that of other local clock signals.

2. The multi-port memory device of claim 1, wherein the predetermined frequency of the local clock signal is set based on a mode register set (MRS) signal.

3. The multi-port memory device of claim 1, wherein the plurality of ports include:
   a first port including a first local clock generator that is configured to generate a first local clock signal having a first frequency based on the internal clock signal;
   a second port including a second local clock generator that is configured to generate a second local clock signal having a second frequency based on the internal clock signal;
   a third port including a third local clock generator that is configured to generate a third local clock signal having a third frequency based on the internal clock signal; and
   a fourth port including a fourth local clock generator that is configured to generate a fourth local clock signal having a fourth frequency based on the internal clock signal.

4. The multi-port memory device of claim 3, wherein the first port is configured to provide first data received from an external source to the memory core, and configured to output second data that is stored in the memory core to an external source in response to the first local clock signal, an address signal, and a command signal.

5. The multi-port memory device of claim 3, wherein the second port is configured to provide first data received from an external source to the memory core, and configured to output second data that is stored in the memory core to an external source in response to the second local clock signal, an address signal, and a command signal.

6. The multi-port memory device of claim 3, wherein the third port is configured to provide first data received from an external source to the memory core, and configured to output second data that is stored in the memory core to an external source in response to the third local clock signal, an address signal, and a command signal.

7. The multi-port memory device of claim 3, wherein the fourth port is configured to provide first data received from an external source to the memory core, and configured to output second data that is stored in the memory core to an external source in response to the fourth local clock signal, an address signal, and a command signal.

8. A method of controlling a multi-port memory device, comprising:
   providing a local clock generator in each port in the multi-port memory device;
   generating an internal clock signal based on an external clock signal;
   generating a local clock signal from each of the local clock generators based on the internal clock signal, the local clock signal having a predetermined frequency, at least one local clock signal having frequency that is different from that of other local clock signals; and
   accessing the memory core in response to the local clock signal.

9. A multi-port memory device comprising:
   a memory core;
   a clock generator configured to generate an internal clock signal based on an external clock signal; and
   a plurality of ports, each port including a local clock generator that is configured to generate a local clock signal based on the internal clock signal, and configured to access the memory core in response to the local clock signal, the local clock signal having a predetermined frequency that is set based on a mode register set (MRS) signal.

* * * * *